United States Patent
Tsai et al.

(10) Patent No.: US 10,483,164 B2
(45) Date of Patent: Nov. 19, 2019

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Yan-Ming Tsai, Miaoli County (TW); Wei-Yip Loh, Hsinchu (TW); Yu-Ming Huang, Tainan (TW); Hung-Hsu Chen, Tainan (TW); Chih-Wei Chang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/881,159

(22) Filed: Jan. 26, 2018

(65) Prior Publication Data

US 2019/0148230 A1    May 16, 2019

Related U.S. Application Data

(60) Provisional application No. 62/585,810, filed on Nov. 14, 2017.

(51) Int. Cl.
*H01L 21/768* (2006.01)
*H01L 21/285* (2006.01)
(Continued)

(52) U.S. Cl.
CPC .. *H01L 21/76889* (2013.01); *H01L 21/28518* (2013.01); *H01L 21/76895* (2013.01); *H01L 23/535* (2013.01); *H01L 29/0847* (2013.01); *H01L 29/165* (2013.01); *H01L 29/45* (2013.01); *H01L 29/665* (2013.01); *H01L 29/6656* (2013.01); *H01L 29/7848* (2013.01)

(58) Field of Classification Search
CPC .................................................. H01L 21/76889
USPC ........................................................ 257/190
See application file for complete search history.

(56) References Cited

U.S. PATENT DOCUMENTS

2008/0079089 A1*  4/2008  Lee ................... H01L 29/66515
                                                        257/384
2009/0146183 A1*  6/2009  Moon ............... H01L 21/28518
                                                        257/192
(Continued)

*Primary Examiner* — Igwe U Anya
(74) *Attorney, Agent, or Firm* — WPAT, P.C., Intellectual Property Attorneys; Anthony King

(57) ABSTRACT

A method for manufacturing a semiconductor includes following steps. An epitaxial structure including a first semiconductor material and a second semiconductor material is provided. A lattice constant of the second semiconductor material is greater than a lattice constant of the first semiconductor material. A metal-containing layer is deposited on the epitaxial structure. The metal containing layer includes a first metal material and a second metal material. An atomic size of the second metal material is greater than an atomic size of the first metal material. The metal-containing layer and the epitaxial structure are annealed to form a metal silicide layer on the epitaxial structure. The metal silicide layer includes the first semiconductor material, the second semiconductor material, the first metal material, and the second metal material.

20 Claims, 18 Drawing Sheets

(51) Int. Cl.
*H01L 23/535* (2006.01)
*H01L 29/165* (2006.01)
*H01L 29/78* (2006.01)
*H01L 29/45* (2006.01)
*H01L 29/08* (2006.01)
*H01L 29/66* (2006.01)

(56) References Cited

U.S. PATENT DOCUMENTS

| | | | |
|---|---|---|---|
| 2012/0007051 A1* | 1/2012 | Bangsaruntip | B82Y 10/00 |
| | | | 257/24 |
| 2013/0175503 A1* | 7/2013 | Cohen | H01L 29/66439 |
| | | | 257/29 |
| 2013/0320451 A1* | 12/2013 | Liu | H01L 29/66545 |
| | | | 257/368 |
| 2014/0057300 A1* | 2/2014 | Hryhorenko | C07K 16/44 |
| | | | 435/7.93 |
| 2016/0053386 A1* | 2/2016 | Mizutani | C23F 1/26 |
| | | | 438/669 |
| 2016/0056054 A1* | 2/2016 | Takahashi | C23F 1/26 |
| | | | 438/754 |
| 2018/0005876 A1* | 1/2018 | Tung | H01L 21/76802 |

* cited by examiner

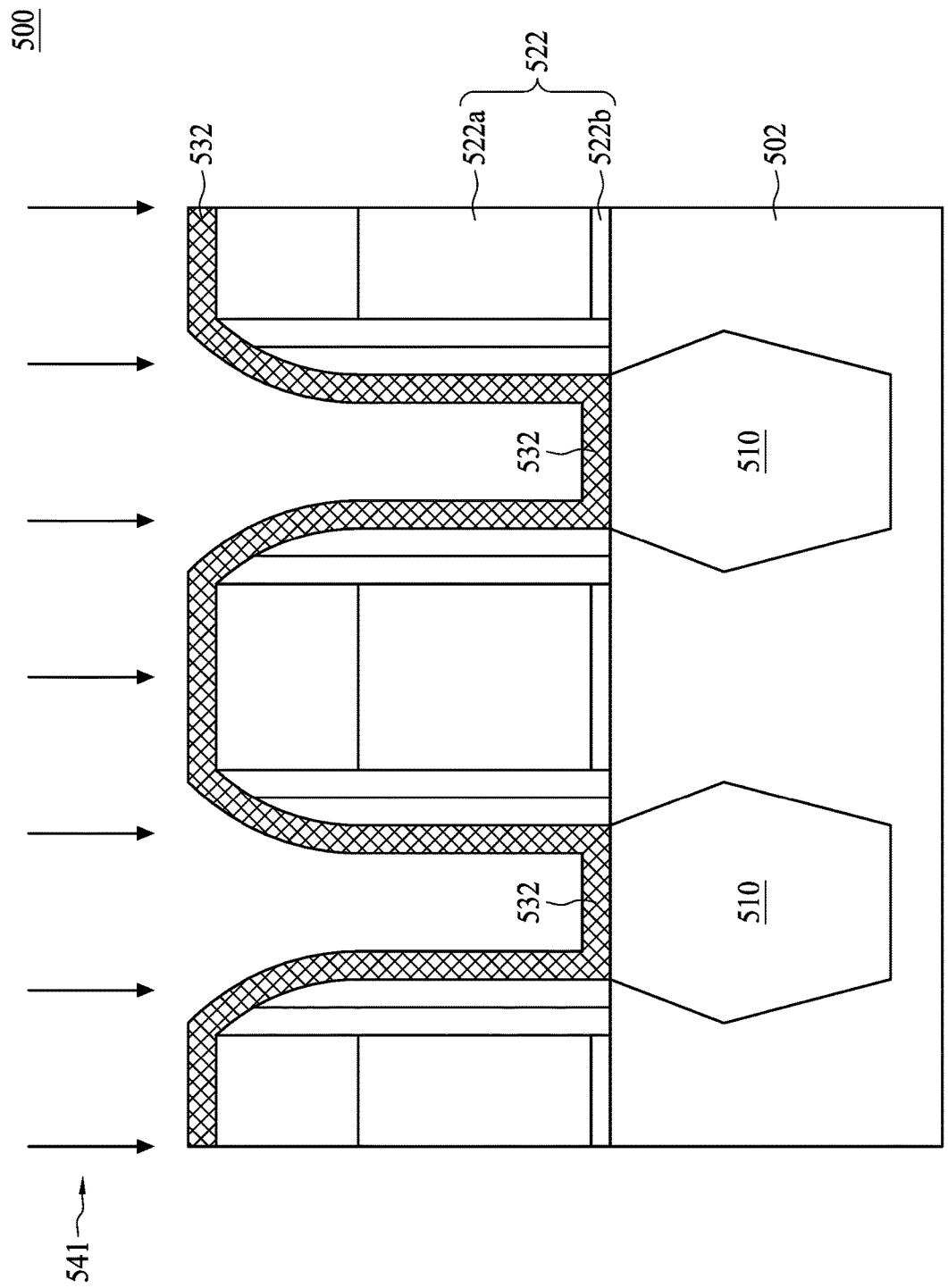

SEMICONDUCTOR STRUCTURE AND METHOD FOR MANUFACTURING THE SAME

PRIORITY DATA

This patent claims the benefit of U.S. Provisional Patent Application Ser. No. 62/585,810 filed Nov. 14, 2017, the entire disclosure of which is hereby incorporated by reference.

BACKGROUND

In the fabrication of integrated circuit devices, logic products are often produced using silicide operations in order to obtain higher circuit performance. In silicidation, a refractory metal layer is deposited on a silicon wafer or a silicon layer and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

As the dimensions within integrated circuits have grown ever smaller, solutions have had to be found to problems relating to misalignment of successive mask patterns relative to one another during operation. Therefore approaches such as salicide (self-aligned silicide) operation is developed to take advantage of the fact that certain metals react when heated in contact with silicon to form conductive silicides but do not react with silicon oxide. Thus, oxide spacers on the vertical walls of the gate pedestal could be used to provide the necessary small, but well-controlled, separation between the source and drain contacts and the gate contact.

Although the salicide operation made possible significant reductions in device size, as devices shrank even further, other issue emerges. For example, as the devices become smaller, the source/drain regions become shallower and salicide induces damage to the subjacent junctions. For example, metal spiking, where the metal diffuses unevenly into the silicon wafer or silicon layer is induced. Consequently, junction leakage is likely to occur. There is therefore a need in the semiconductor processing art to develop a method for forming improved salicides having reduced parasitic electrical leakage while maintaining a low sheet resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5E are schematic drawings illustrating a semiconductor structure at various fabrication stages constructed according to aspects of the present disclosure in one or more embodiments.

DETAILED DESCRIPTION

Figure 1:
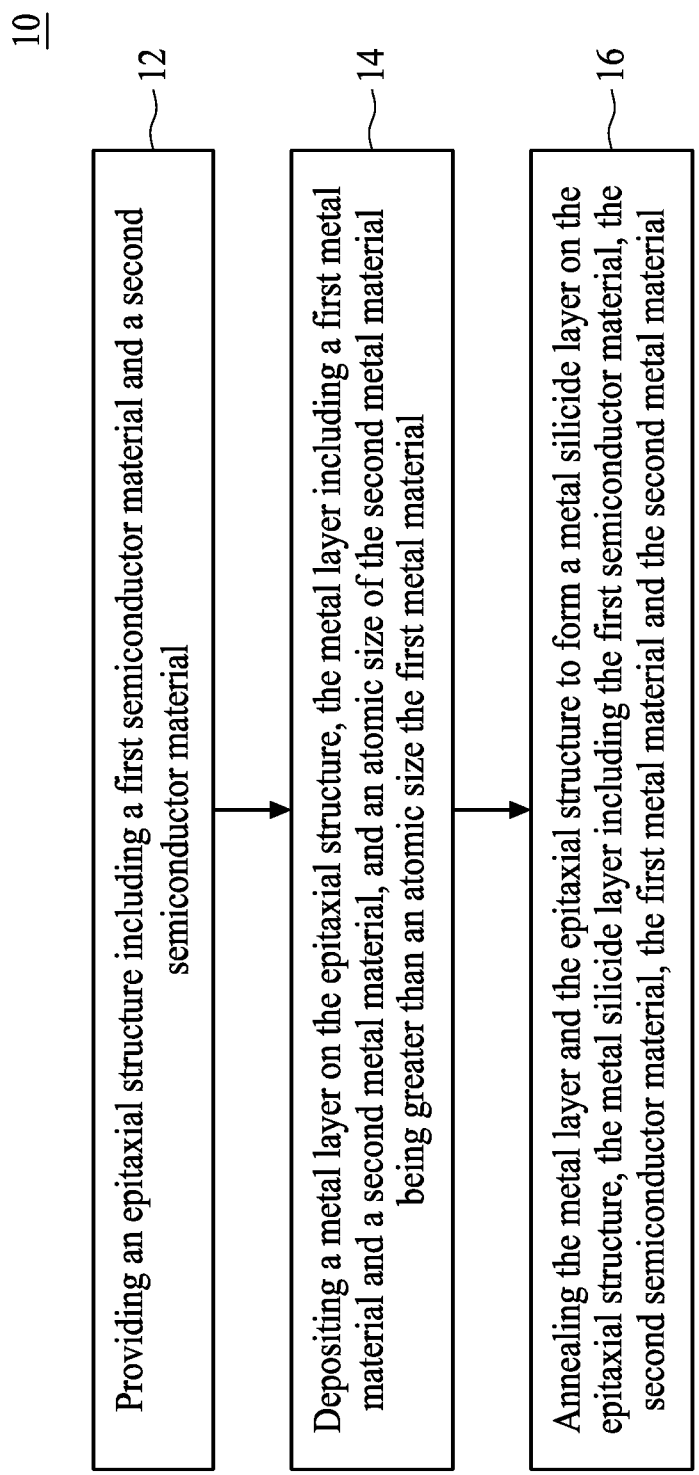
FIG. 1 is a flow chart representing a method for manufacturing a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

A prevalent way of reducing contact resistance between polysilicon gates and source/drain regions and interconnect lines is by forming a metal silicide atop the source/drain regions and the gate electrodes prior to application of the conductive film for formation of the various conductive interconnect lines. Presently, In some embodiments, a metal layer, such as titanium (Ti), is blanketly deposited over the semiconductor substrate, specifically over exposed source/drain and gate electrode regions, and the wafer is then subjected to one or more annealing steps, for example at a temperature of 800° C. or higher for titanium. This annealing operation causes the metal to selectively react with the exposed silicon of the source/drain regions and the gate electrodes, thereby forming a metal silicide (e.g., $TiSi_2$).

A thin silicide layer is more resistive than a thicker silicide layer of the same material. The formation of a thick silicide layer, however, may cause a high junction leakage current and low reliability, particularly when forming ultra-shallow junctions, due to the metal spiking issue. In some embodiments, such spiking issue is even worse when the metal silicide is formed on an epitaxial structure such as silicon germanium (SiGe), which may have defects such as vacancies, clustering and voids. In some embodiments spiking along the vacancy or void defect in the epitaxial SiGe structure is referred to as Ti/Ge extrusion or piping.

The present disclosure therefore provides a method for manufacturing a semiconductor structure that is able to mitigate the metal spiking or extrusion issue. In some embodiments, the present disclosure provides large-sized metal ions deposited or implanted before anneal. Such large-sized metal ions obstruct diffusing paths and thus suppress metal diffusion or extrusion. Accordingly, metal spiking is mitigated.

FIG. 1 is a flow chart representing a method for manufacturing a semiconductor structure 10 according to aspects of the present disclosure. The method for manufacturing the semiconductor structure 10 includes an operation 12, providing an epitaxial structure including a first semiconductor material and a second semiconductor material. The method for manufacturing the semiconductor structure 10 further includes an operation 14, depositing a metal layer on the epitaxial structure, the metal layer including a first metal material and a second metal material, and an atomic size of the second metal material being greater than an atomic size of the first metal material. The method for manufacturing the semiconductor structure 10 further includes an operation 16, annealing the metal layer and the epitaxial structure to form a metal silicide layer on the epitaxial structure, the metal silicide layer including the first semiconductor material, the second semiconductor material, the first metal material and the second metal material. The method for manufacturing the semiconductor structure 10 will be further described according to one or more embodiments. It should be noted that the operations of the method for manufacturing the semiconductor structure 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
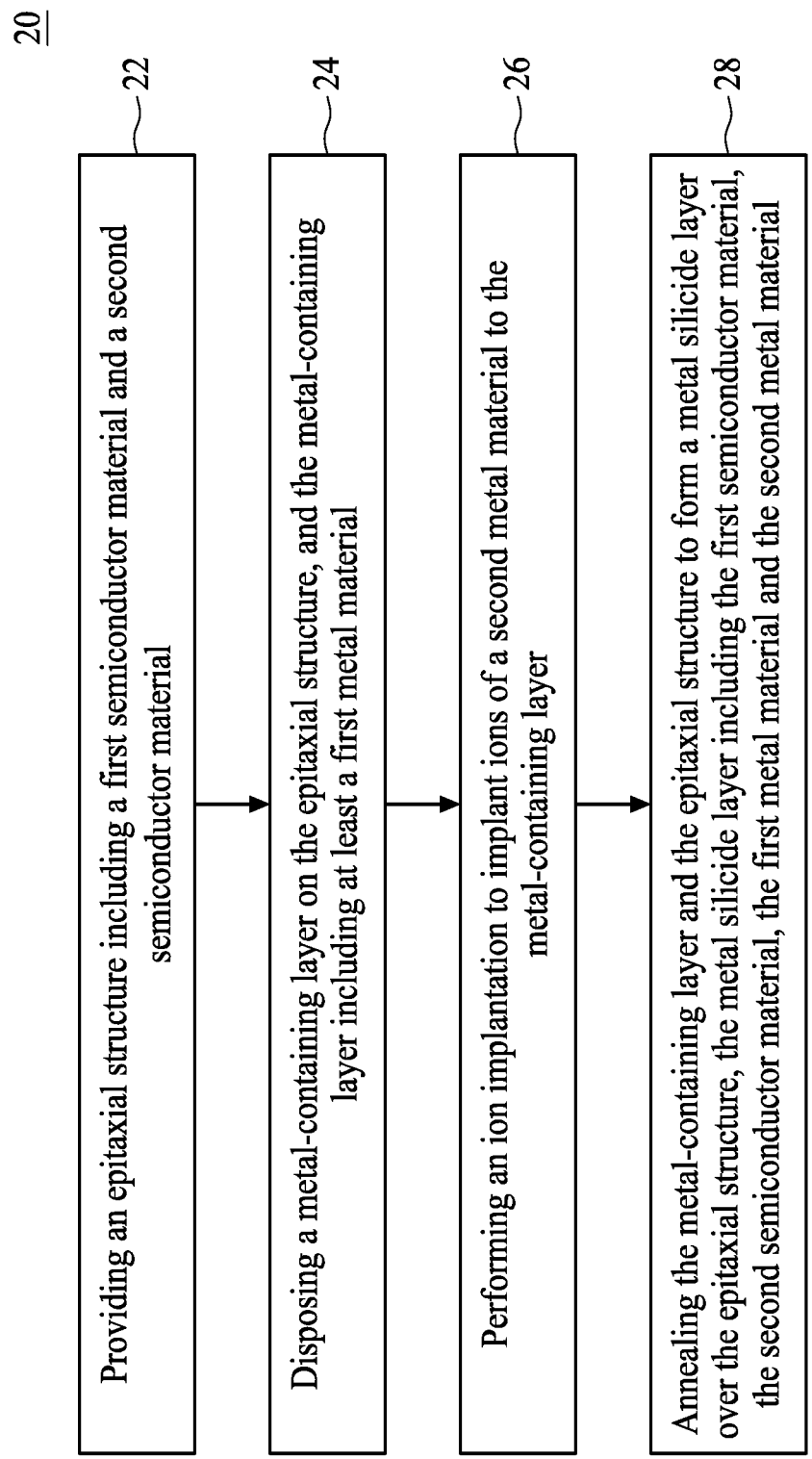
FIG. 2 is a flow chart representing a method for manufacturing a semiconductor structure according to aspects of the present disclosure.

FIG. 2 is a flow chart representing a method for manufacturing a semiconductor structure 20 according to aspects of the present disclosure. The method for manufacturing the semiconductor structure 20 includes an operation 22, providing an epitaxial structure including a first semiconductor material and a second semiconductor material. The method for manufacturing the semiconductor structure 20 further includes an operation 24, disposing a metal-containing layer on the epitaxial structure, and the metal-containing layer including at least a first metal material. The method for manufacturing the semiconductor structure further includes an operation 26, performing an ion implantation to implant ions of a second metal material to the metal-containing layer. The method for manufacturing the semiconductor structure 20 further includes an operation 28, annealing the metal-containing layer and the epitaxial structure to form a metal silicide layer over the epitaxial structure, the metal silicide layer including the first semiconductor material, the second semiconductor material, the first metal material and the second metal material. The method for manufacturing the semiconductor structures 20 will be further described according to one or more embodiments. It should be noted that the operations of the method for manufacturing the semiconductor structure 20 may be rearranged or otherwise modified within the scope of the various aspects. It is further noted that additional processes may be provided before, during, and after the method 20, and that some other processes may only be briefly described herein. Thus other implementations are possible within the scope of the various aspects described herein.

Figure 3:
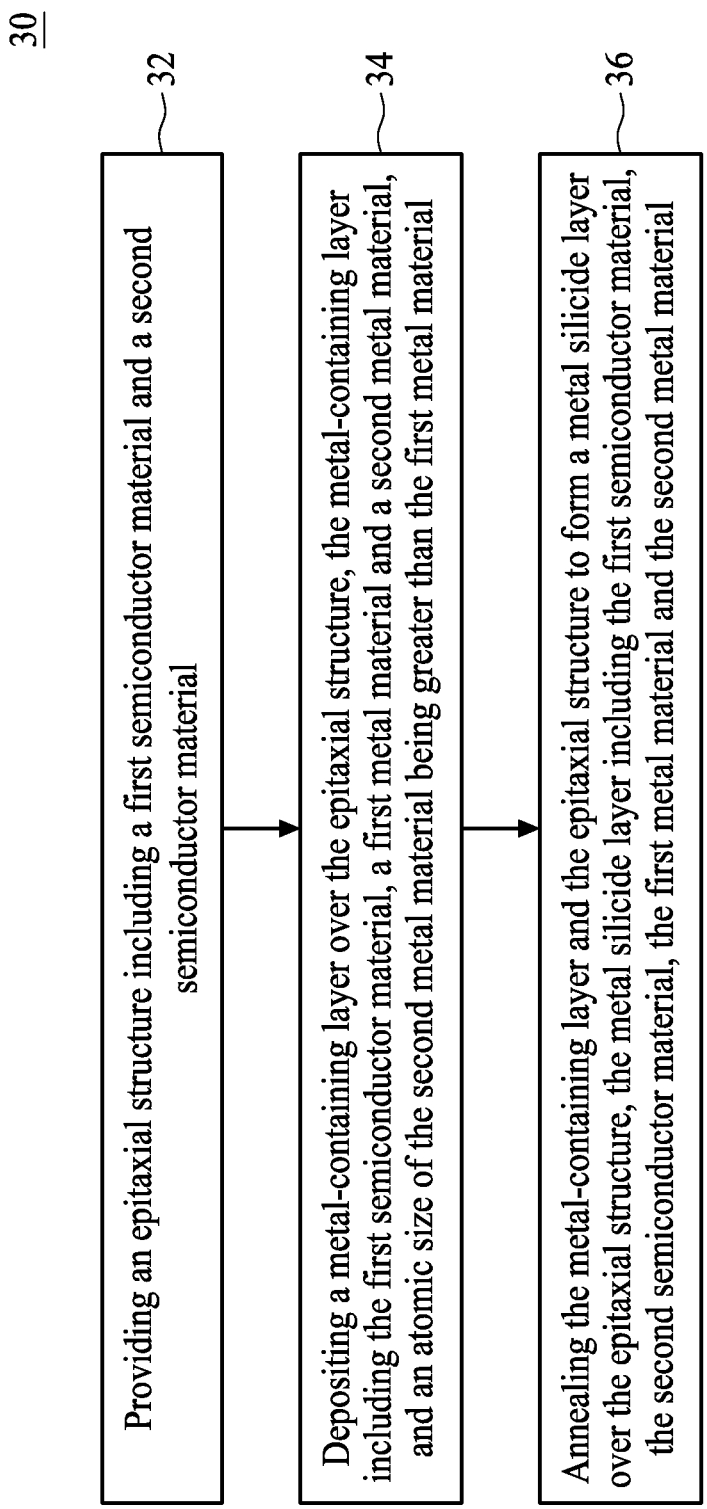
FIG. 3 is a flow chart representing a method for manufacturing a semiconductor structure according to aspects of the present disclosure.

FIG. 3 is a flow chart representing a method for manufacturing a semiconductor structure 30 according to aspects of the present disclosure. The method for manufacturing the semiconductor structure 30 includes an operation 32, providing an epitaxial structure including a first semiconductor material and a second semiconductor material. The method for manufacturing the semiconductor structure 30 includes an operation 34, depositing a metal-containing layer over the epitaxial structure, the metal containing layer including the first semiconductor material, a first metal material and a second metal material, and an atomic size of the second metal material being greater than an atomic size of the first metal material. The method for manufacturing the semiconductor structure 30 includes an operation 36, annealing the metal-containing layer and the epitaxial structure to form a metal silicide layer over the epitaxial structure, the metal silicide layer including the first semiconductor material, the second semiconductor material, the first metal material and the second metal material. The method for manufacturing the semiconductor structures 30 will be further described according to one or more embodiments. It should be noted that the operations of the method for manufacturing the semiconductor structure 30 may be rearranged or otherwise modified within the scope of the various aspects. It is further noted that additional processes may be provided before, during, and after the method 30, and that some other processes may only be briefly described herein. Thus other implementations are possible within the scope of the various aspects described herein.

Figure 4A:
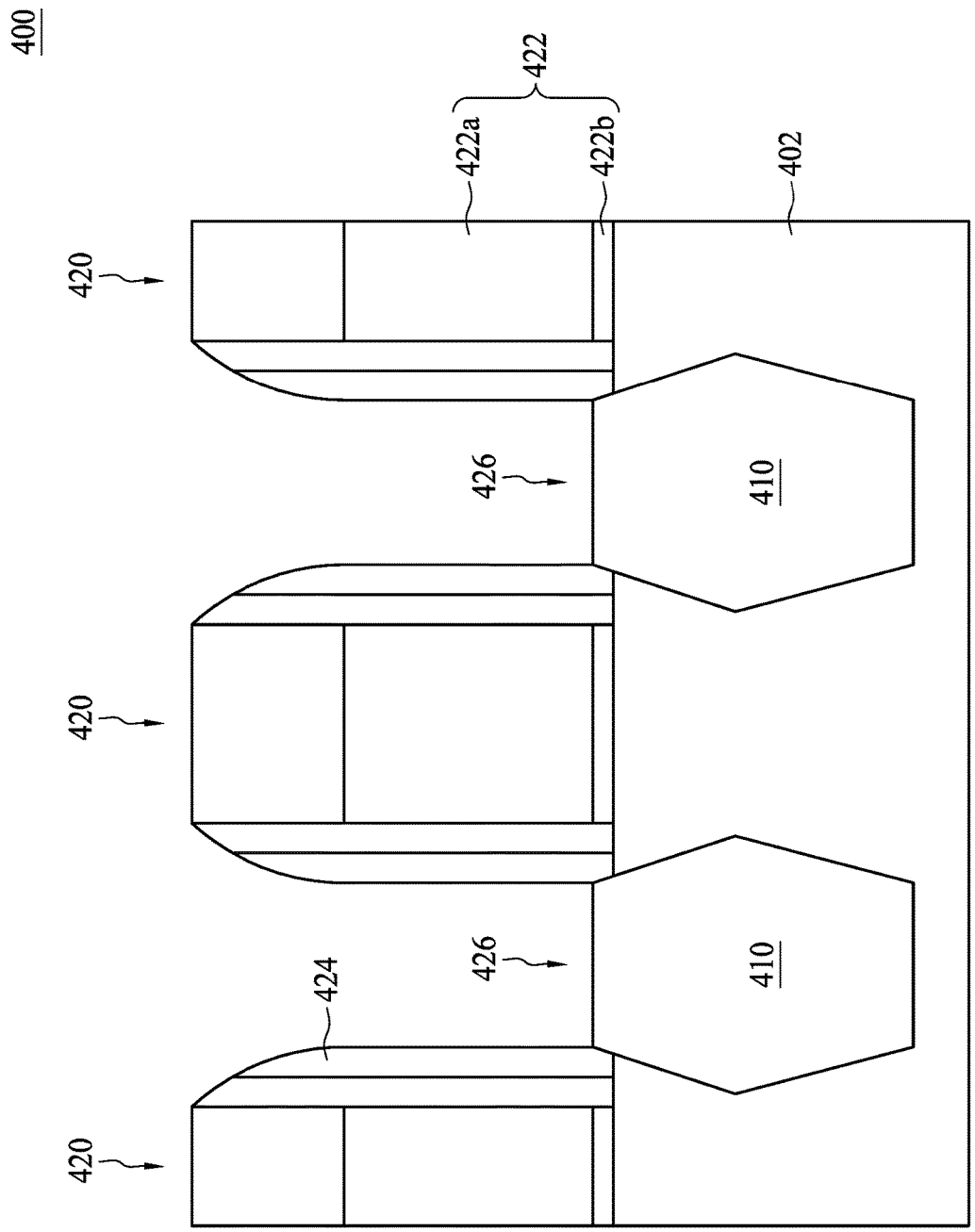
FIGS. 4A-4E are schematic drawings illustrating a semiconductor structure at various fabrication stages constructed according to aspects of the present disclosure in one or more embodiments.

FIGS. 4A-4E are schematic drawings illustrating a semiconductor structure 400 at various fabrication stages constructed according to aspects of the present disclosure in one or more embodiments. Referring to FIG. 4A, an epitaxial structure 410 is provided according to the operation 12. In some embodiments, the epitaxial structure 410 is formed in a substrate 402. In some embodiments, a transistor device 420, which may be for example a P-typed field effect transistor (PFET) in a CMOS device such as an integrated circuits incorporating PFET and NFET transistors, is formed over the substrate 402. The transistor device 420 includes a gate structure 422 including a gate electrode 422a and a gate dielectric layer 422b. In some embodiments, the gate electrode 422a can be a polysilicon gate, a polysilicon dummy gate, or a metal gate electrode, by the disclosure is not limited to this. On sidewalls of the gate structure 422 are spacers 424. In some embodiments, the spacers 422 are multi-layered structure, but the disclosure is not limited thereto. On opposing sides of the gate structure 422 and the spacers 424 are source/drain 426 formed within the substrate 402. In some embodiments, the source/drain 426 includes the epitaxial structure 410 serving as a source/drain stressor. The epitaxial structure 410 includes a first semiconductor material and a second semiconductor material different from the first semiconductor material. In some embodiments, a lattice constant of the first semiconductor material is different from that of the second semiconductor material. In some embodiments, the lattice constant of the second semiconductor material is greater than the lattice constant of the first semiconductor material. In some embodiments, in which the transistor device 420 is a PFET device, the first semiconductor material includes Si and the second semiconductor material includes Ge, but the disclosure is not limited to this. In some embodiments, the formation of the epitaxial structure 410 may be achieved by etching the substrate 402 to form recesses therein, and then performing an epitaxy to grow the epitaxial structure 410 in the recesses.

In some embodiments, Ge concentration in the epitaxial structure 410 may be increased to increase stress. In some embodiments, the epitaxial structure 410 can include a multi-layered structure, and each layer of the multi-layered structure includes a different Ge concentration that is upwardly increased from a bottom of the recess. Further, depending on a specification requirement of the transistor device 420, a suitable range of Ge concentration could be drawn to yield an optimum level of performance. In some embodiments, high Ge concentration in the epitaxial structure 410 may incorporate boron (B) to provide the required semiconductor doping to form the PFET, and to lower sheet resistance and thus improve contact resistance in the SiGe source/drain 426.

Figure 4B:
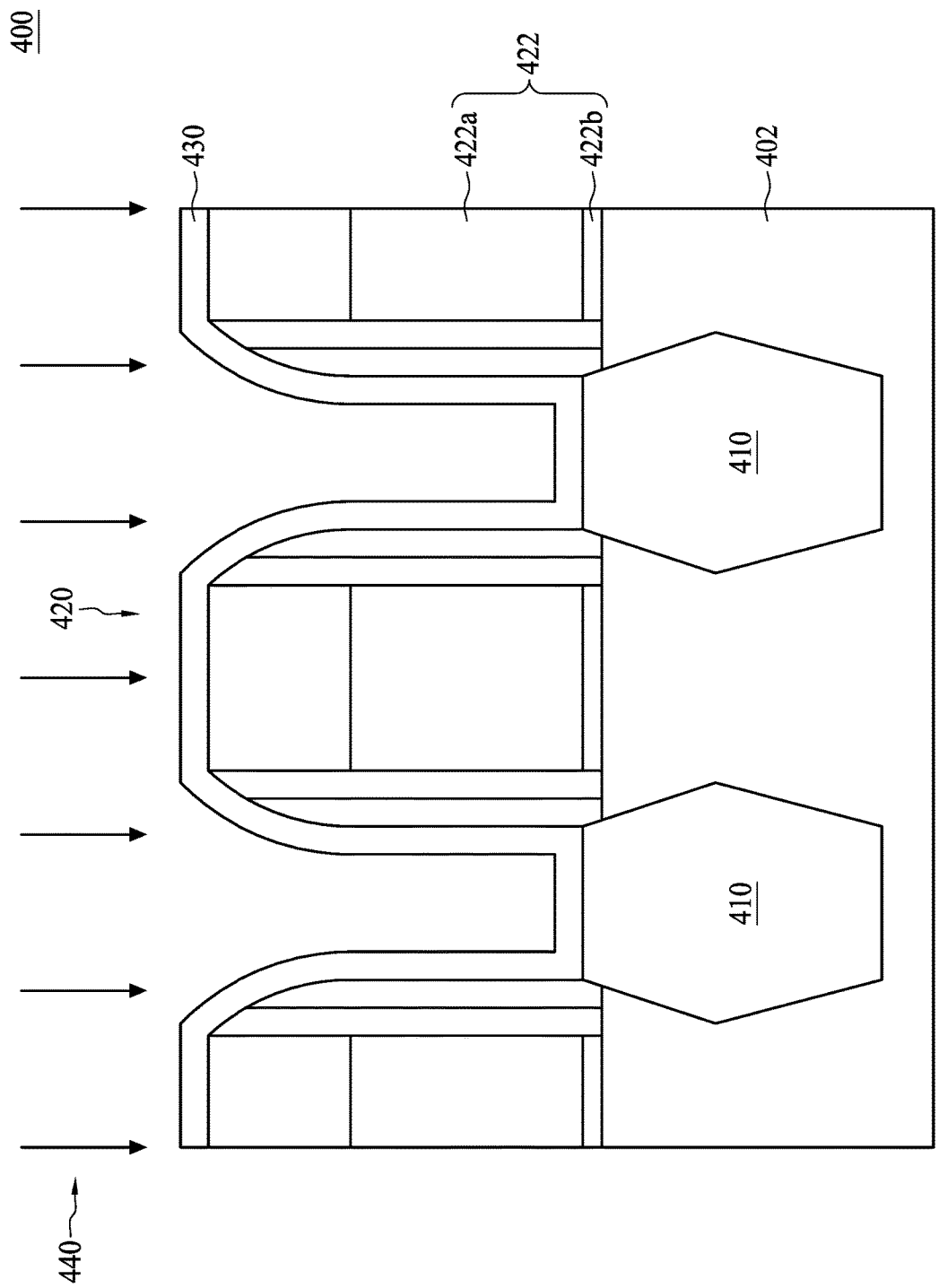

Referring to FIG. 4B, a metal layer 430 is deposited over the substrate 402, particularly on the epitaxial structure 410 according to the operation 14. In some embodiments, the metal layer 430 includes a first metal material and a second metal material, and an atomic size of the second metal material is greater than an atomic size of the first metal material. In some embodiments, the first metal material includes Ti and the second metal material includes tungsten (W), tantalum (Ta), platinum (Pt), niobium (Nb), or gold (Au), but the disclosure is not limited thereto. In some embodiments, a concentration of the second metal material in the metal layer 430 is less than a concentration of the first metal material in the metal layer 430. In some embodiments, the concentration of the second metal material in the metal layer 430 is between about 1% and about 30%, but the disclosure is not limited thereto. In some embodiments, the metal layer 430 is deposited over the substrate 402 by a physical vapor deposition (PVD) 440, but the disclosure is not limited to this. In some embodiments, a thickness of the metal layer 430 is between about 3 nanometers (nm) and about 15 nm, but the disclosure is not limited thereto.

Figure 4C:
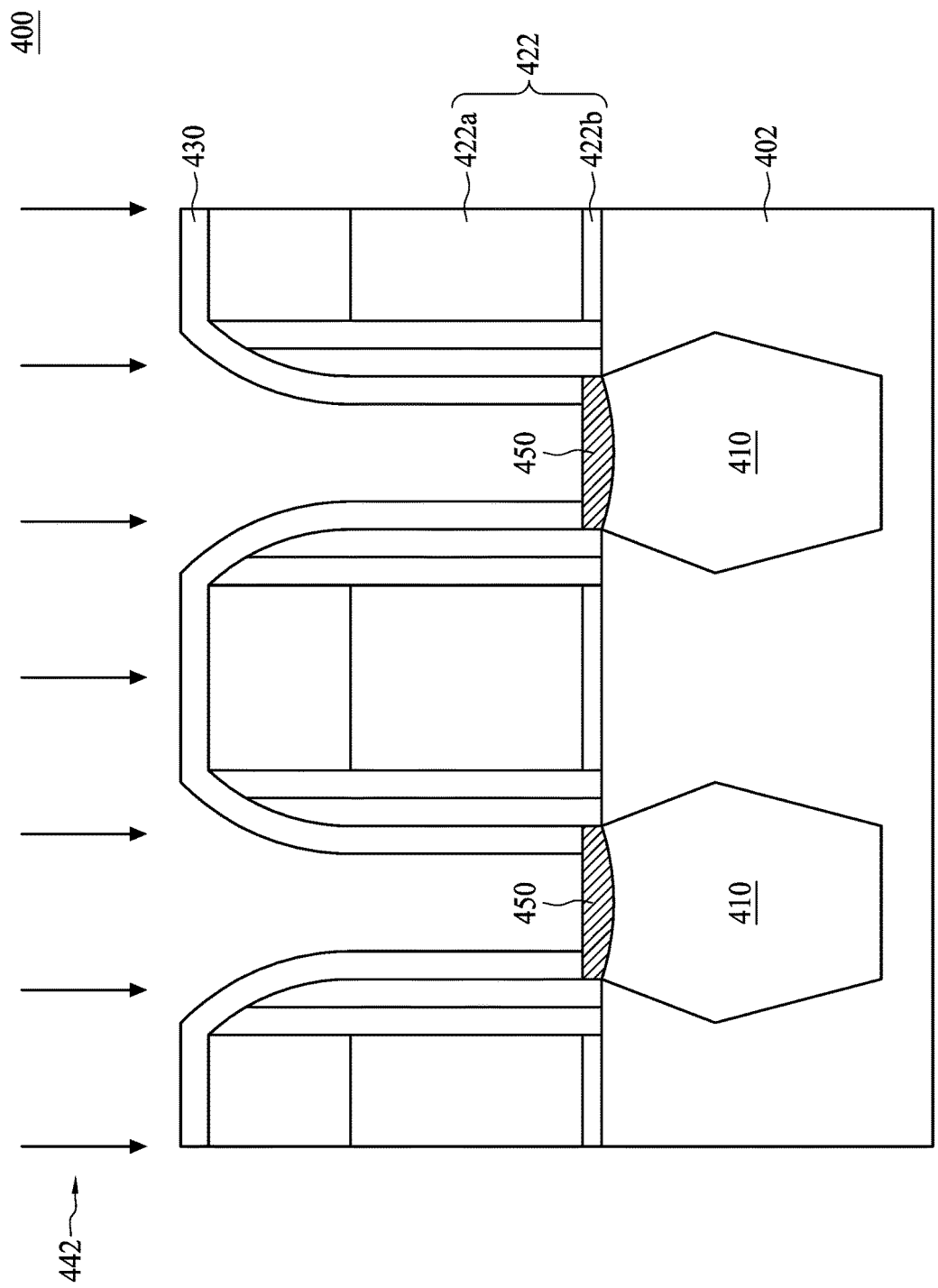

Referring to FIG. 4C, the metal layer 430 and the epitaxial structure 410 are annealed according to the operation 16. In some embodiments, a temperature of the anneal 442 is between about 400° C. and about 900° C., but the disclosure is not limited thereto. The anneal 442 is performed such that the first metal material and the second metal material in the metal layer 430 react with the first semiconductor material and the second semiconductor material in the epitaxial structure 410. Thus, the metal silicide layer 450 including the first semiconductor material, the second semiconductor material, the first metal material and the second metal material is formed in accordance with the operation 16. Additionally, since four materials are involved to form the metal silicide layer 450, the metal silicide layer 450 can be referred to as a quaternary metal silicide layer. In some embodiments, the quaternary metal silicide layer 450 includes $Ti_xSiGe$, and X includes W, Ta, Pt, Nb, or Au.

Figure 4D:
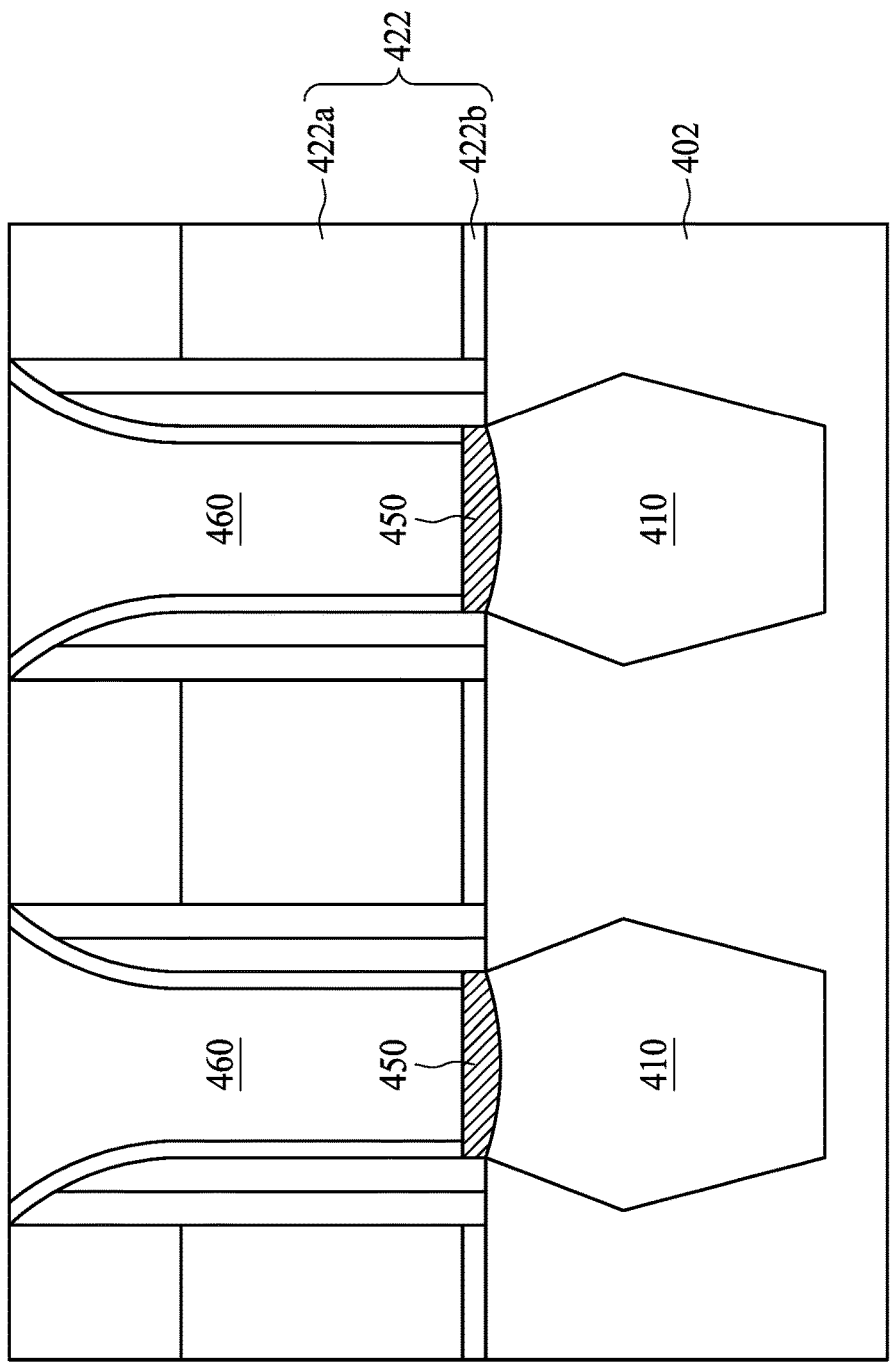
Figure 4E:
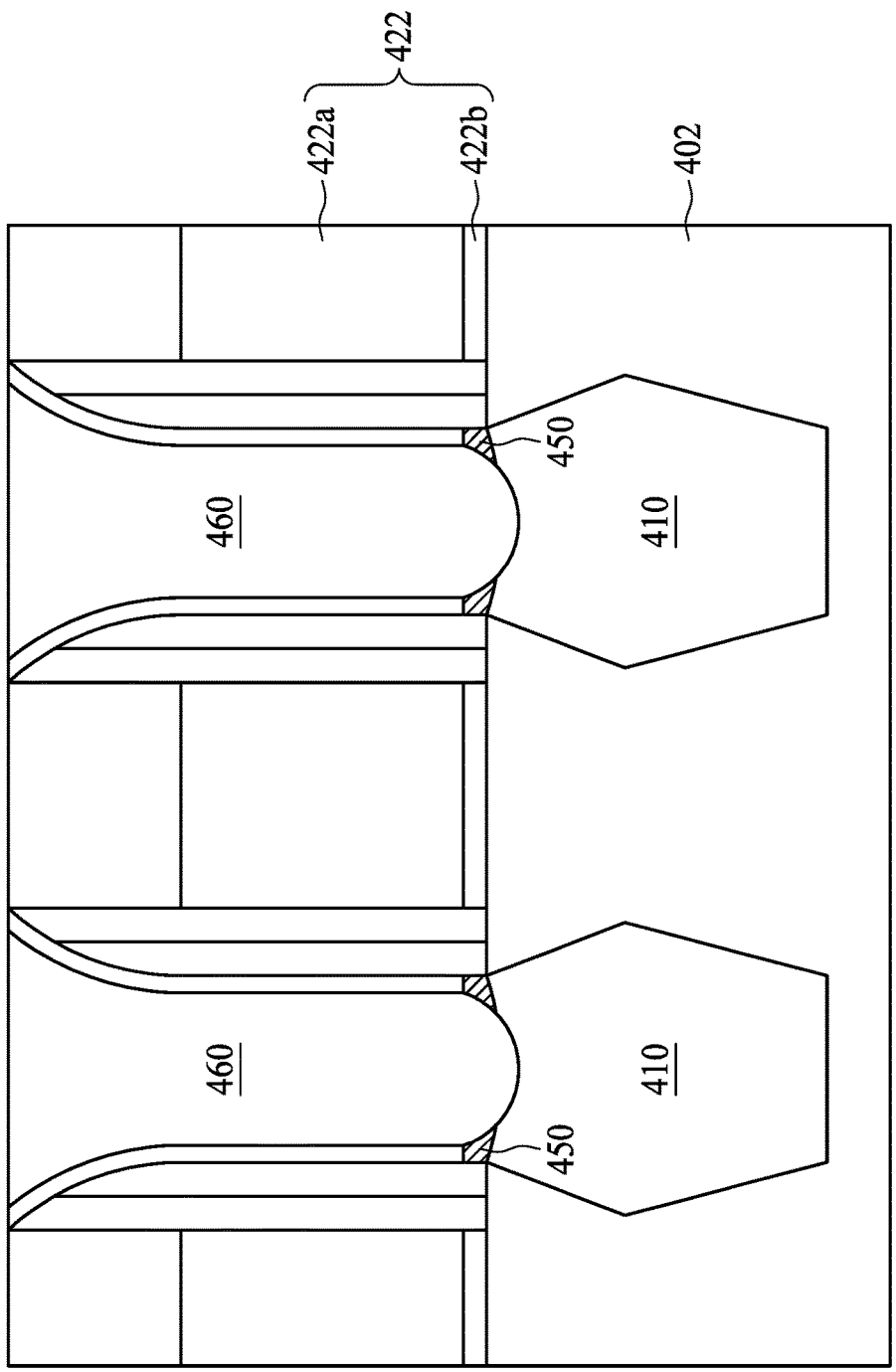

Referring to FIGS. 4D and 4E, after forming the metal silicide layer 450, un-reacted metal layer 430 is removed from the substrate 402 and the spacers 424. Thereafter, a contact etch stop layer (CESL) (not shown) is formed over the substrate 402. In some embodiments, CESL includes silicon nitride (SiN), silicon carbide (SiC), or other dielectric materials, but the disclosure is not limited thereto. An inter-layer dielectric (ILD) layer (not shown) is formed over CESL, and a conductive plug 460 is formed in the ILD and CESL and over the source/drain 426. The conductive plug 460 is formed over the epitaxial structure 410. In some embodiments, the conductive plug 460 lands on and contacts the metal silicide layer 450 as shown in FIG. 4D. In some embodiments, the conductive plug 460 penetrates the metal silicide layer 450 to land on and contact the epitaxial structure 410 as shown in FIG. 4E, but the disclosure is not limited thereto.

Referring to FIGS. 4D and 4E, accordingly the semiconductor structure 400 is provided. The semiconductor structure 400 includes the epitaxial structure 410 including the first semiconductor material and the second semiconductor material, and the quaternary metal silicide layer 450 formed on the epitaxial structure 410. More importantly, the quaternary metal silicide layer 450 includes the first semiconductor material, the second semiconductor material, the first metal material and the second metal material. As mentioned above, the lattice constant of the second semiconductor material is greater than a lattice constant of the first semiconductor material. As mentioned above, the atomic size of the second metal material is greater than the atomic size of the first metal material. In some embodiments, the quaternary metal silicide layer 450 includes $Ti_xSiGe$, and X includes W, Ta, Pt, Nb, or Au, but the disclosure is not limited thereto. In some embodiments, a concentration of the second metal material in the quaternary metal silicide layer 450 is less than a concentration of the first metal material in the quaternary metal silicide layer 450. Additionally, the semiconductor structure 400 can include at least the conductive plug 460 in some embodiments. As shown in FIG. 4D, the conductive plug 460 lands on the quaternary metal silicide layer 450 in some embodiments. As shown in FIG. 4E, the conductive plug 460 penetrates the quaternary metal silicide layer 450 and land on the epitaxial structure 410 in some embodiments.

It should be noted that although the embodiments are described with respect to illustrative examples in a specific context, such as boron doped, epitaxial growth, SiGe embedded stressors for source/drain in PFET, the method for manufacturing the semiconductor structure 10 may also be applied, however, to other semiconductor devices, including other stressor materials.

Figure 5A:
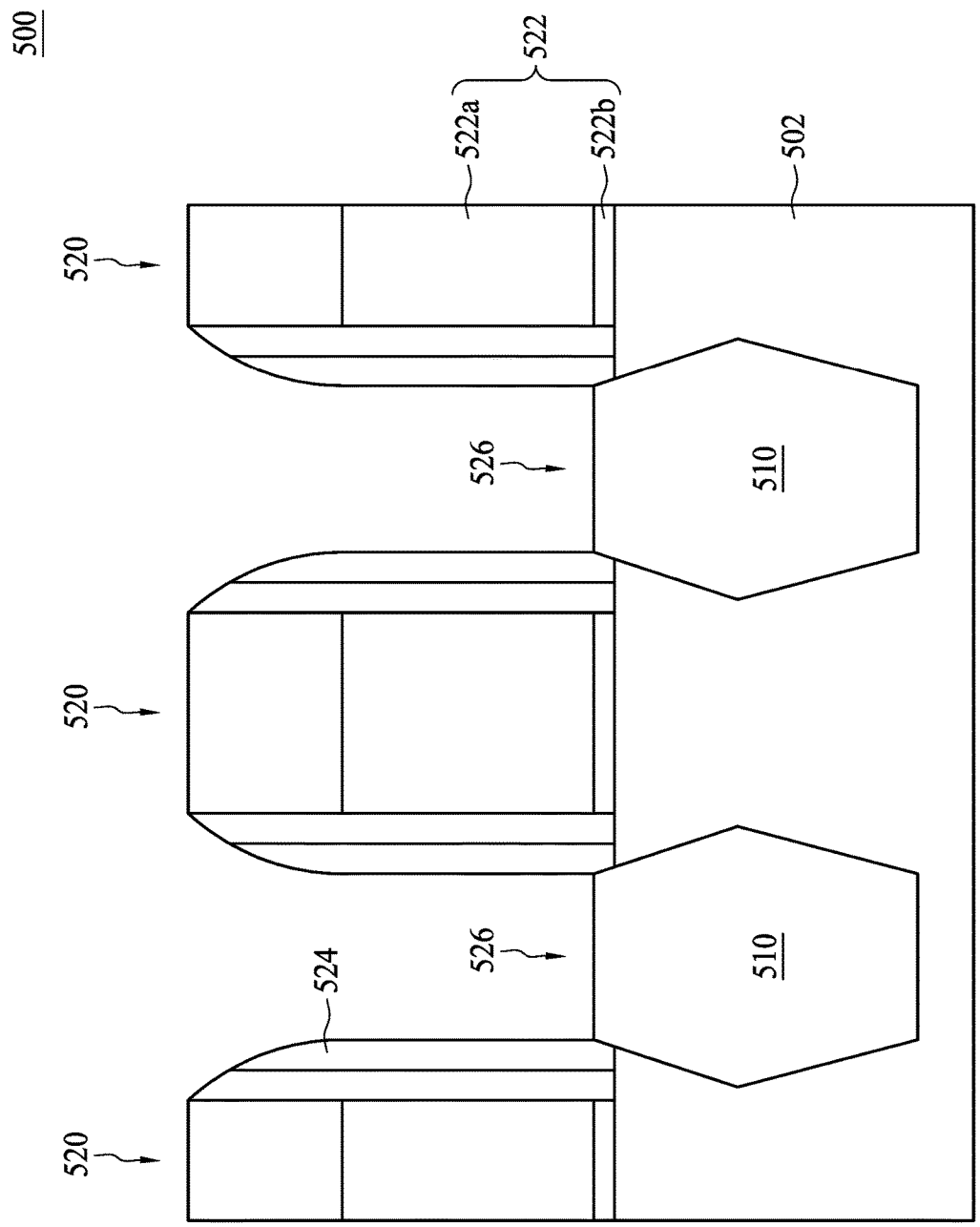

FIGS. 5A-5E are schematic drawings illustrating a semiconductor structure 500 at various fabrication stages constructed according to aspects of the present disclosure in one or more embodiments. It should be easily understood that same elements in FIGS. 5A-5E and FIGS. 4A-4E can include same material thus those details are omitted in the interest of brevity. Referring to FIG. 5A, an epitaxial structure 510 is provided according to the operation 22. In some embodiments, the epitaxial structure 510 is formed in a substrate 502. In some embodiments, a transistor device 520, which may be for example a PFET in a CMOS device such as an integrated circuits incorporating PFET and NFE, is formed over the substrate 502. The transistor device 520 includes a gate structure 522 including a gate electrode 522a and a gate dielectric layer 522b. On opposing sidewalls of the gate structure 522 are spacers 524, and the spacers 524 can be multi-layered structures, but the disclosure is not limited thereto. On opposing sides of the gate structure 522 and the spacers 524 are source/drain 526 formed within the substrate 502. In some embodiments, the source/drain 526 includes the epitaxial structure 510 serving as a source/drain stressor. The epitaxial structure 510 includes a first semiconductor material and a second semiconductor material different from the first semiconductor material. In some embodiments, a lattice constant of the first semiconductor material is different from that of the second semiconductor material. In some embodiments, the lattice constant of the second semiconductor material is greater than the lattice constant of the first semiconductor material. In some embodiments, in which the transistor device 520 is a PFET, the first semiconductor material includes Si and the second semiconductor material includes Ge, but the disclosure is not limited to this. As mentioned above, in some embodiments, boron may be incorporated to provide the required semiconductor doping to form the PFET, and to lower sheet resistance and thus improve contact resistance in the SiGe source/drain 526.

Figure 5B:
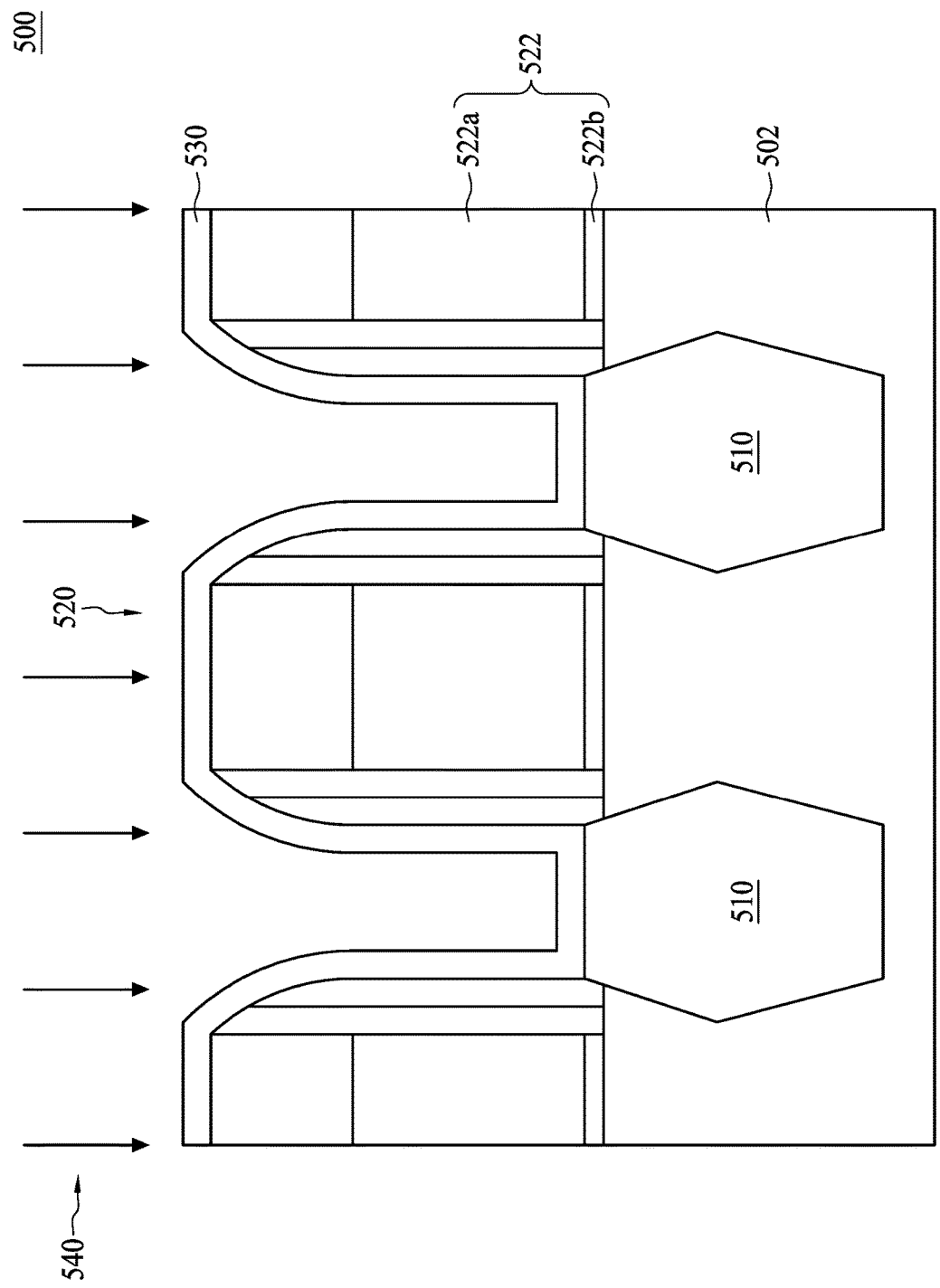

Referring to FIG. 5B, a metal-containing layer 530 is deposited over the substrate 502, particularly on the epitaxial structure 510 according to the operation 24. In some embodiments, the metal-containing layer 530 includes a first metal material. In some embodiments, the first metal material includes Ti, but the disclosure is not limited to this. In some embodiments, the metal-containing layer 530 includes not only the first metal material, but also the first semiconductor material. In some embodiments, the metal-containing layer 530 includes $TiSi_X$, but the disclosure is not limited to this. In some embodiments, a thickness of the metal-containing layer 530 is between about 3 nm and about 15 nm, but the disclosure is not limited to this. The metal-containing layer 530 can be deposited over the substrate 502 by any suitable deposition operation 540.

Referring to FIG. 5C, an ion implantation 541 is performed according to the operation 26. More importantly, the ion implantation 540 is to implant ions of a second metal material to the metal-containing layer 530 in accordance with the operation 26. In some embodiments, an atomic size of the second metal material is greater than an atomic size of the first metal material. For example but not limited to, the second metal material can include W, Ta, Pt, Nb, or Au. In some embodiments, an implant concentration and an implant energy can be $1E13/cm^2$~$1E16/cm^2$ and 0.5~10 KeV, but the disclosure is not limited to this. Accordingly, an implanted metal-containing layer 532 is obtained, as shown in FIG. 5C.

Figure 5D:
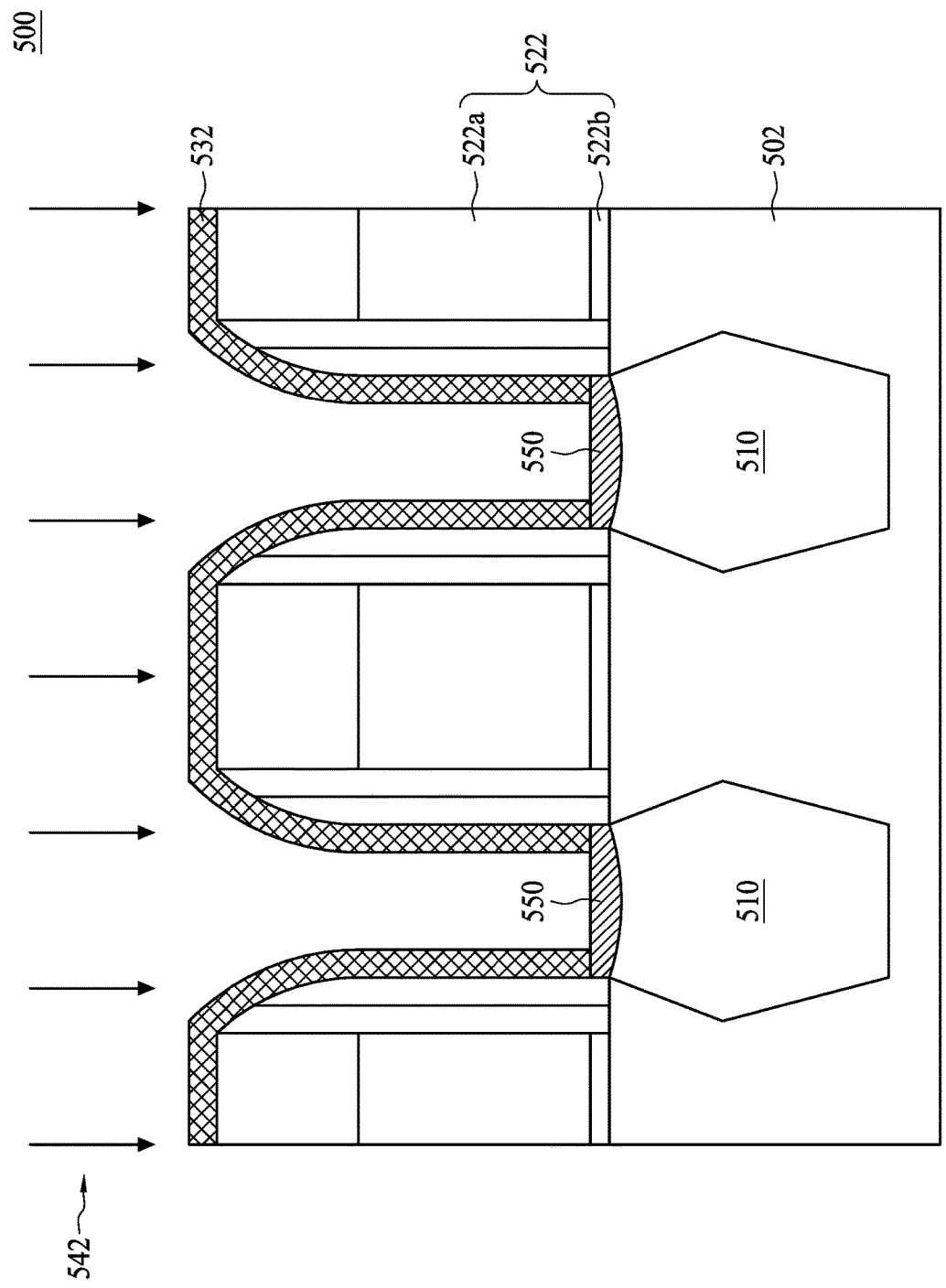

Referring to FIG. 5D, the metal-containing layer 530, the implanted metal-containing layer 532 and the epitaxial structure 510 are annealed according to the operation 28. In some embodiments, a temperature of the anneal 542 is between about 400° C. and about 900° C., but the disclosure is not limited thereto. The anneal 542 is performed such that the first metal material and the second metal material in the implanted metal-containing layer 532 react with the first semiconductor material and the second semiconductor material in the epitaxial structure 510. Thus, the metal silicide layer 550 including the first semiconductor material, the second semiconductor material, the first metal material and the second metal material is formed in accordance with the operation 28. Additionally, since four materials are involved to form the metal silicide layer 550, the metal silicide layer 550 can be referred to as a quaternary metal silicide layer. In some embodiments, the quaternary metal silicide layer 450 includes TiXSiGe, and X includes W, Ta, Pt, Nb, or Au. Further, a concentration of the second metal material in the metal silicide layer 550 is less than a concentration of the first metal material in the metal silicide layer 550.

Figure 5E:
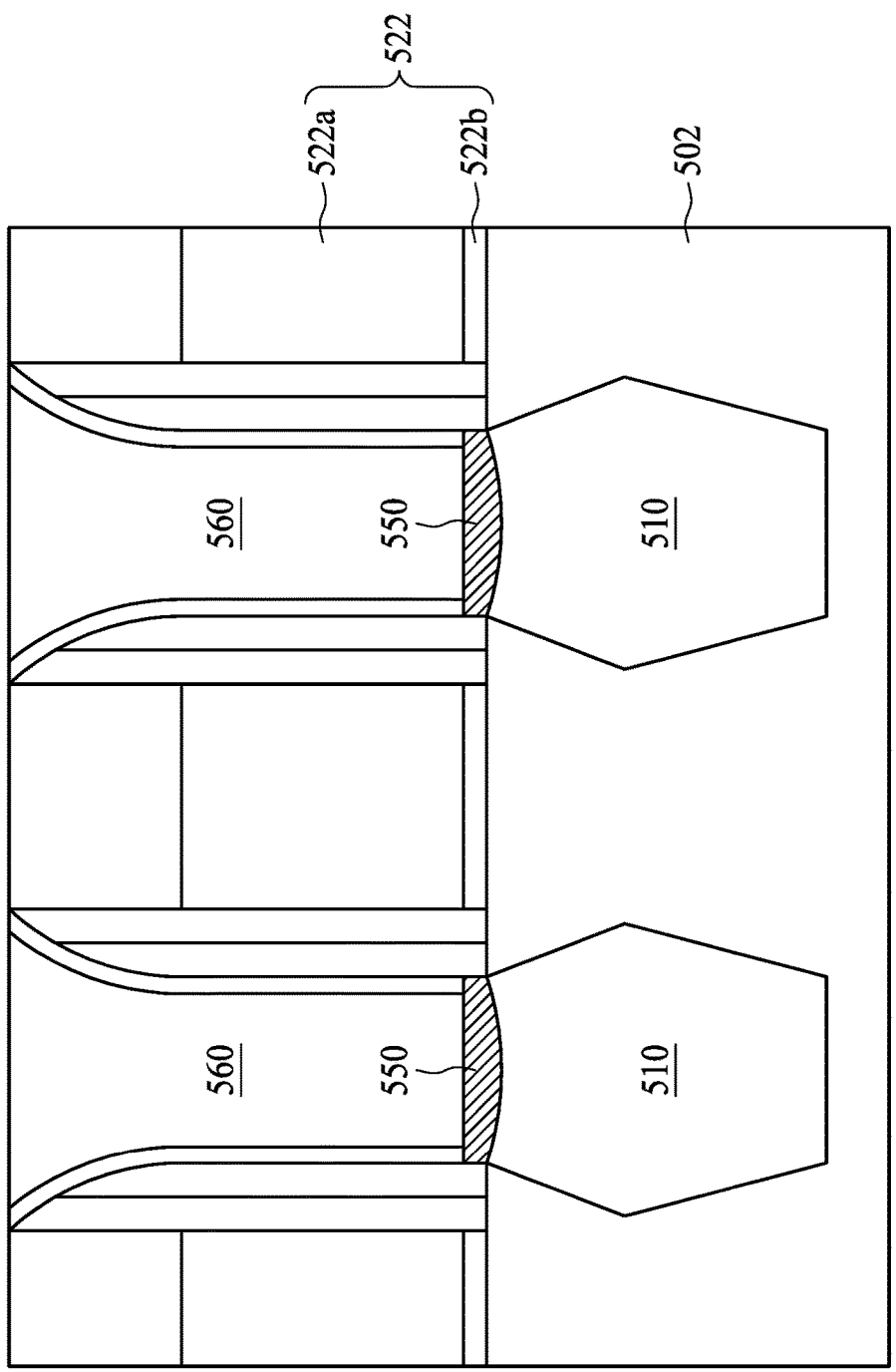

Referring to FIG. 5E, after forming the metal silicide layer 550, un-reacted portion of the implanted metal-containing layer 532 is removed from the substrate 502 and the spacers 524. Thereafter, a CESL (not shown) is formed over the substrate 502, and followed by forming an ILD layer (not shown) over CESL. A conductive plug 560 is formed in the ILD and CESL and over the source/drain 526. In some embodiments, the conductive plug 560 is formed over the epitaxial structure 510. In some embodiments, the conductive plug 560 lands on and contacts the metal silicide layer 550 as shown in FIG. 5E. In some embodiments, the conductive plug 560 penetrates the metal silicide layer 550 to land on and contact the epitaxial structure 510 (not shown), but the disclosure is not limited thereto.

Still referring to FIG. 5E, accordingly the semiconductor structure 500 is provided. The semiconductor structure 500 includes the epitaxial structure 510 including the first semiconductor material and the second semiconductor material, and the quaternary metal silicide layer 550 formed on the epitaxial structure 510. More importantly, the quaternary metal silicide layer 550 includes the first semiconductor material, the second semiconductor material, the first metal material and the second metal material. As mentioned above, the lattice constant of the second semiconductor material is greater than the lattice constant of the first semiconductor material. As mentioned above, the atomic size of the second metal material is greater than the atomic size of the first metal material. In some embodiments, the quaternary metal silicide layer 550 includes $Ti_XSiGe$, and X includes W, Ta, Pt, Nb, or Au, but the disclosure is not limited thereto. In some embodiments, a concentration of the second metal material in the quaternary metal silicide layer 550 is less than a concentration of the first metal material in the quaternary metal silicide layer 550. Additionally, the semiconductor structure 500 can include at least the conductive plug 560 in some embodiments. As shown in FIG. 5E, the conductive plug 560 lands on the quaternary metal silicide layer 550 in some embodiments. In some embodiments, the conductive plug penetrates the quaternary metal silicide layer 550 to land on and contact the epitaxial structure 510.

It should be noted that although the embodiments are described with respect to illustrative examples in a specific context, such as boron doped, epitaxial growth, SiGe embedded stressors for source/drain in PFET, the method for manufacturing the semiconductor structure 20 may also be applied, however, to other semiconductor devices, including other stressor materials.

Figure 6A:
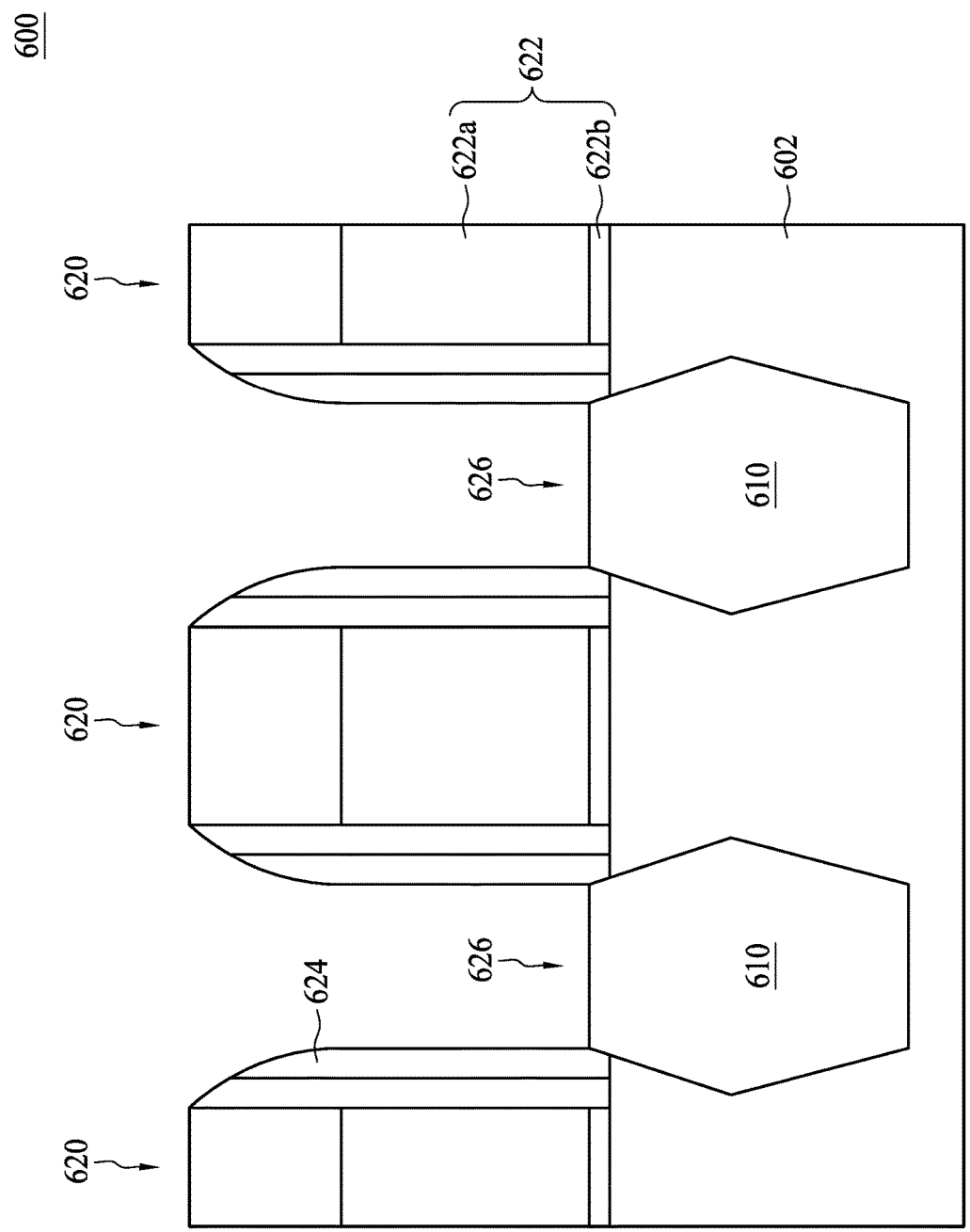
FIGS. 6A-6D are schematic drawings illustrating a semiconductor structure at various fabrication stages constructed according to aspects of the present disclosure in one or more embodiments.

FIGS. 6A-6D are schematic drawings illustrating a semiconductor structure 600 at various fabrication stages constructed according to aspects of the present disclosure in one or more embodiments. It should be easily understood that same elements in FIGS. 6A-6D and FIGS. 4A-4E can include same material thus those details are omitted in the interest of brevity. Referring to FIG. 6A, an epitaxial structure 610 is provided according to the operation 32. In some embodiments, the epitaxial structure 610 is formed in a substrate 602. As mentioned above, a transistor device 620 can be formed over the substrate 602. The transistor device 620 includes a gate structure 622 including a gate electrode 622a and a gate dielectric layer 622b. On opposing sidewalls of the gate structure 622 are spacers 624, and the spacers 624 are multi-layered structures, but the disclosure is not limited thereto. On opposing sides of the gate structure 622 and the spacers 624 are source/drain 626 formed within the substrate 602. In some embodiments, the source/drain 626 includes the epitaxial structure 610 serving as a source/drain stressor. The epitaxial structure 610 includes a first semiconductor material and a second semiconductor material different from the first semiconductor material. In some embodiments, a lattice constant of the first semiconductor material is greater than the lattice constant of the first semiconductor material. In some embodiments, in which the transistor device 620 is a PFET, the first semiconductor material includes Si and the second semiconductor material includes Ge, but the disclosure is not limited to this. In some embodiments, the formation of the epitaxial structure 610 may be achieved by etching the substrate 602 to form recessed therein, and then performing an epitaxy to grow the epitaxial structure 610 in the recesses. As mentioned above, depending on a specification requirement of the transistor device 620, a suitable range of Ge concentration could be drawn to yield an optimum level of performance. In some embodiments, boron can be incorporated to provide the required semiconductor doping to form the PMOS transistor, and to lower sheet resistance and thus improve contact resistance in the SiGe source/drain 626.

Figure 6B:
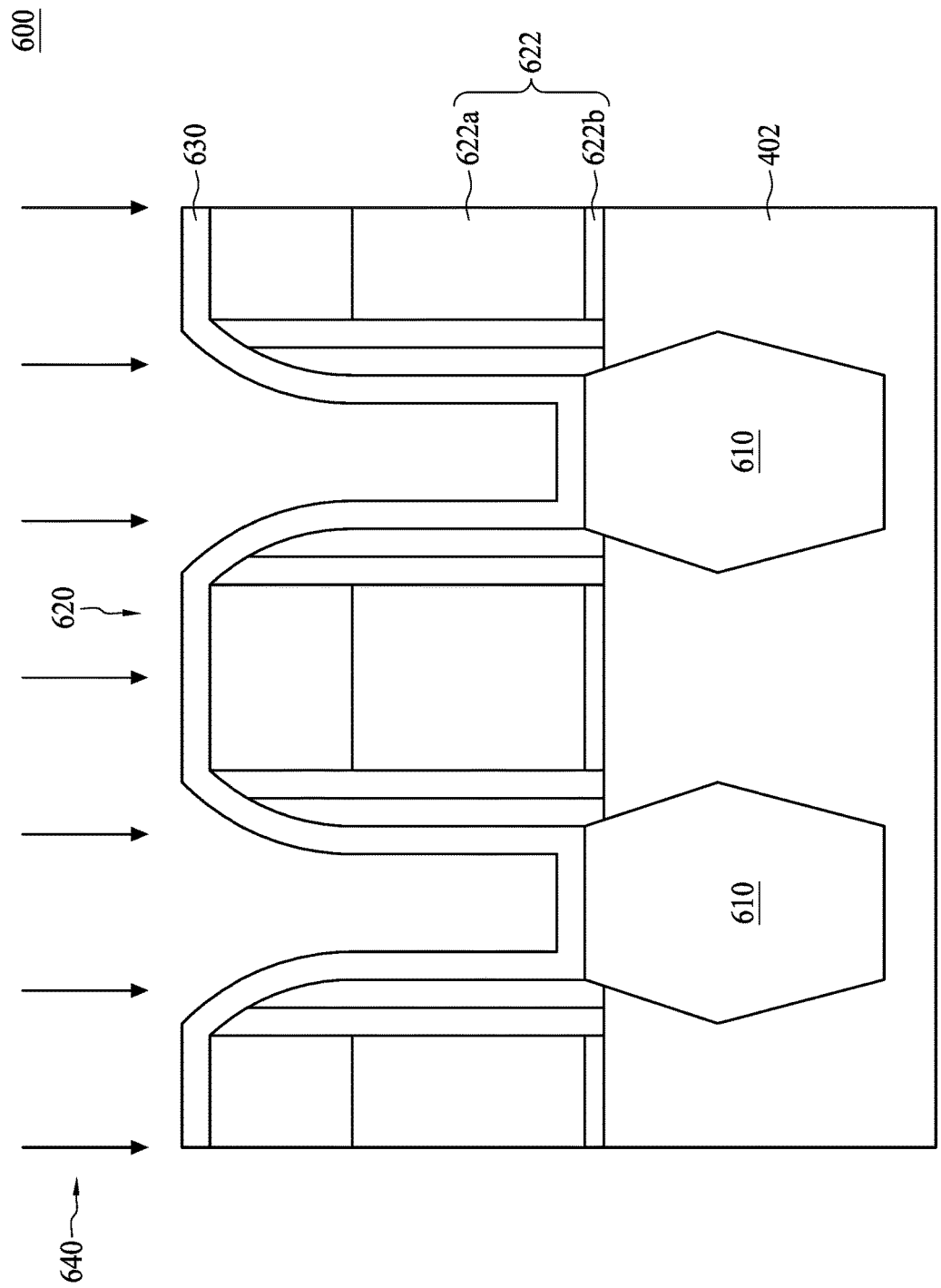

Referring to FIG. 6B, a metal-containing layer 630 is deposited over the substrate 602, particularly on the epitaxial structure 610 according to the operation 34. In some embodiments, the metal-containing layer 630 includes the first semiconductor material, a first metal material and a second metal material. More importantly, an atomic size of the second metal material is greater than an atomic size of the first metal material. In some embodiments, the first metal material includes Ti and the second metal material includes W, Ta, Pt, Nb, or Au, but the disclosure is not limited thereto. In some embodiments, a concentration of the second metal material in the metal-containing layer 630 is less than a concentration of the first metal material in the metal-containing layer 630. In some embodiments, the concentration of the second metal material in the metal-containing layer 630 is between about 1% and about 30%, but the disclosure is not limited thereto. In some embodiments, the metal-containing layer 630 is deposited over the substrate 602 by a chemical vapor deposition (CVD) 640, but the disclosure is not limited to this. For example but not limited to, tungsten hexafluoride (WF$_6$) is added in a titanium silicide (TiSi) CVD 640 in which a reactant gas mixture containing silane (SiH$_4$) or disilane (Si$_2$H$_6$) and titanium tetrachloride (TiCl$_4$) or Titanium Tetrafluoride or (TiF$_4$) are used. In some embodiments, a thickness of the metal-containing layer 630 is between about nm and about 15 nm, but the disclosure is not limited thereto.

Figure 6C:
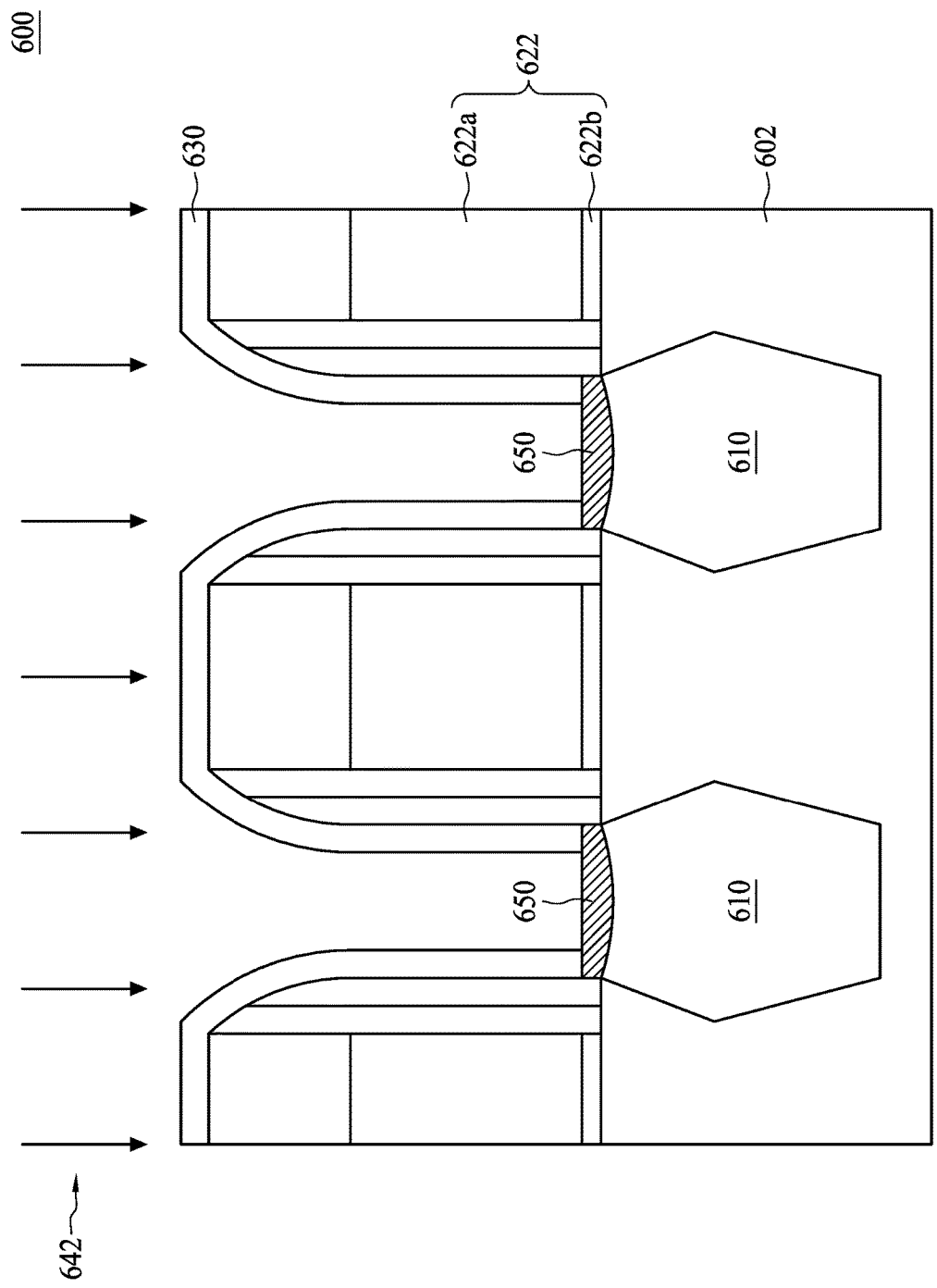

Referring to FIG. 6C, the metal-containing layer 630 and the epitaxial structure 610 are annealed according to the operation 36. In some embodiments, a temperature of the anneal 642 is between about 400° C. and about 900° C., but the disclosure is not limited thereto. The anneal 642 is performed such that the first metal material and the second metal material in the metal layer 630 react with the first semiconductor material and the second semiconductor material in the epitaxial structure 610. Thus, the metal silicide layer 650 including the first semiconductor material, the second semiconductor material, the first metal material and the second metal material is formed in accordance with the operation 36. Additionally, since four materials are involved to form the metal silicide layer 650, the metal silicide layer 650 can be referred to as a quaternary metal silicide layer. In some embodiments, the quaternary metal silicide layer 650 includes Ti$_x$SiGe, and X includes W, Ta, Pt, Nb, or Au.

Figure 6D:
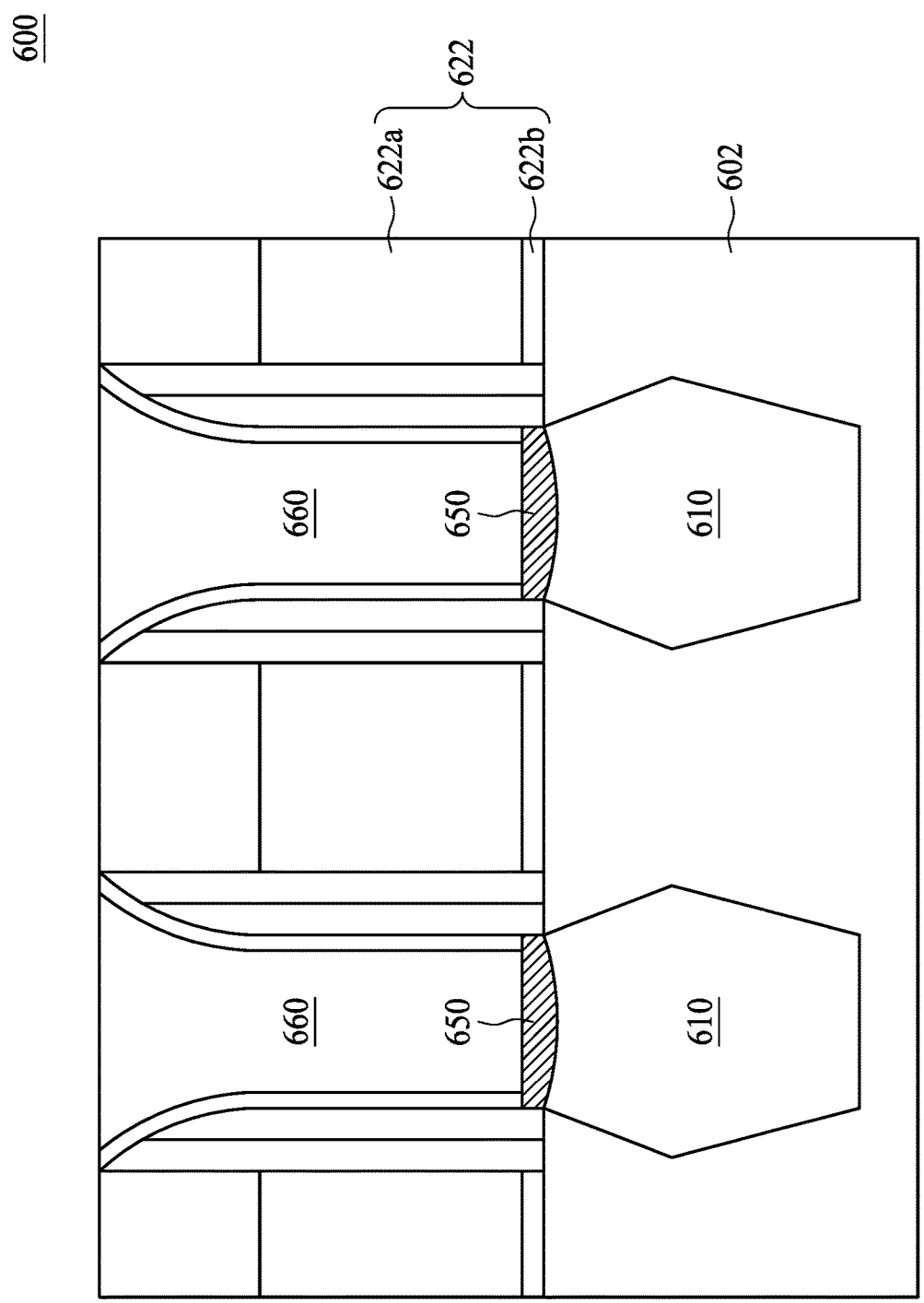

Referring to FIG. 6D, after forming the metal silicide layer 650, un-reacted metal-containing layer 630 is removed from the substrate 602 and the spacers 624. Thereafter, a CESL (not shown) is formed over the substrate 602, and followed by forming an ILD layer (not shown) over CESL. A conductive plug 660 is formed in the ILD and CESL and over the source/drain 626. The conductive plug 660 is formed over the epitaxial structure 610. In some embodiments, the conductive plug 660 lands on the metal silicide layer 650 as shown in FIG. 6D. In some embodiments, the conductive plug 660 penetrates the metal silicide layer 650 to land on and contact the epitaxial structure 610 (not shown), but the disclosure is not limited thereto.

Still referring to FIG. 6D, accordingly the semiconductor structure 600 is provided. The semiconductor structure 600 includes the epitaxial structure 610 including the first semiconductor material and the second semiconductor material, and the quaternary metal silicide layer 650 formed over the epitaxial structure 610. More importantly, the quaternary metal silicide layer 650 includes the first semiconductor material, the second semiconductor material, the first metal material and the second metal material. As mentioned above, the lattice constant of the second semiconductor material is greater than the lattice constant of the first semiconductor material. As mentioned above, the atomic size of the second metal material is greater than the atomic size of the first metal material. In some embodiments, the quaternary metal silicide layer 650 includes Ti$_x$SiGe, and X includes W, Ta, Pt, Nb, or Au, but the disclosure is not limited thereto. In some embodiments, a concentration of the second metal material in the quaternary metal silicide layer 650 is less than a concentration of the first metal material in the quaternary metal silicide layer 650. Additionally, the semiconductor structure 400 can include at least the conductive plug 660 in some embodiments. As shown in FIG. 6D, the conductive plug 660 lands on the quaternary metal silicide layer 650 in some embodiments.

It should be noted that although the embodiments are described with respect to illustrative examples in a specific context, such as boron doped, epitaxial growth, SiGe embedded stressors for source/drain in PMOS transistors, the method for manufacturing the semiconductor structure 30 may also be applied, however, to other semiconductor devices, including other stressor materials.

Figure 7:
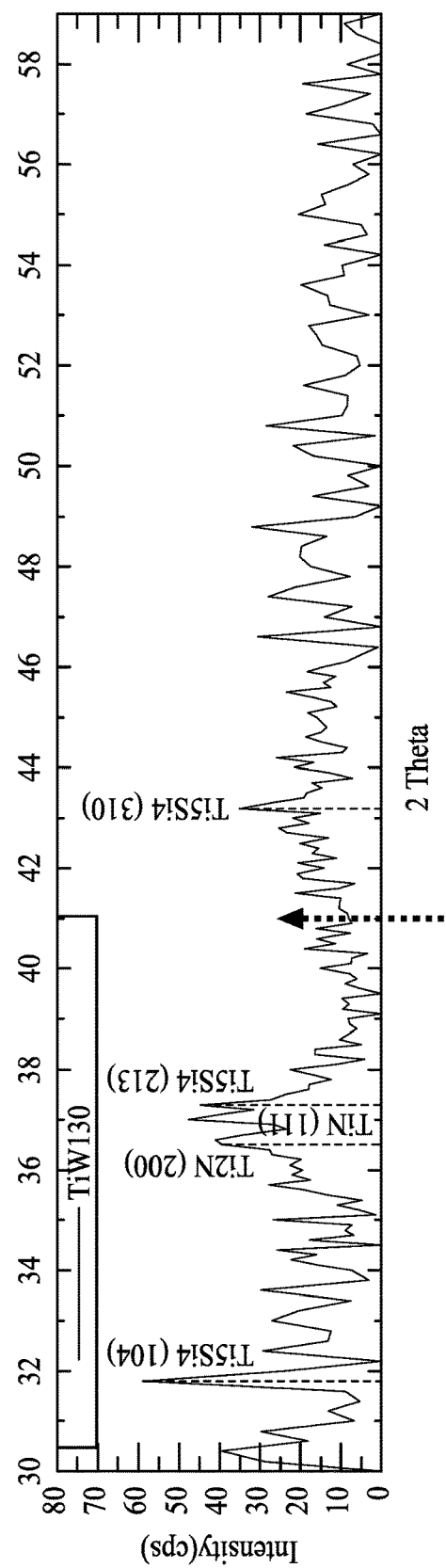
FIG. 7 shows a graph of intensity versus diffraction angle for an X-ray diffraction (XRD) analysis.

Please refer to FIG. 7, which shows a graph of intensity versus diffraction angle for an X-ray diffraction (XRD) analysis of the quaternary metal silicide layer 630. It should be easily understood that same results can be observed for the quaternary metal silicide layer 430 and 530, therefore those details are omitted. As measured by XRD, at the angles (2θ) equal to about 41 degrees, where the meta-stable C49 TiSi$_X$ might be found, there is no vertical peak appeared. Therefore it can be concluded that the quaternary metal silicide layer 630 includes improved silicide quality by reducing the formation of meta-stable C49 TiSi$_X$.

By reducing the formation of meta-stable C49 TiSi$_X$, the quaternary metal silicide layer 630 shows improved performance in post back-end-of-line (BEOL) thermal or electrode migration test. It is noteworthy that such improvement is achieved in a relatively lower anneal temperature. As mentioned above, the temperature of the anneal 442/542/642 is lower than 600° C., which is much lower than the anneal whose temperature is about 800° C. in some embodiments. Further, since tungsten has higher melting point, tungsten remains relatively stable and thus is able to obstruct Ti spiking. In the epitaxial structure 610, which includes dislocation and vacancy defect, such Ti-spiking obstruction is more appreciable. Additionally, TiSiGe diffusion or extrusion along the vacancy is also obstructed by tungsten. In other words, tungsten can suppress TiSiGe diffusion/extrusion and Ti-spiking, and thus quaternary metal silicide layer 630 includes improved stability and reliability. Further, it is found the quaternary metal silicide layer 630 is more stable, and has lower resistance due to less oxidation.

Further, in some embodiments that boron is over-doped in the epitaxial structure for improving contact resistance in the epitaxial structure, interstitials or vacancies are created. Consequently, TiSiGe diffusion and/or Ti-spiking are even worse in those embodiments. Additionally, boron may tend to out-diffuse into the transistor channel region, therefore stability and reliability of the transistor device is adversely impacted. However, by forming the quaternary metal silicide layer 630 including the second metal that improving silicide reliability and stability, boron over-doping is no longer in need. Thus the boron out-diffuse, TiSiGe diffusion and/or Ti-spiking issues are all mitigated.

Accordingly, the present disclosure provides methods for manufacturing a semiconductor structure 10, 20 and 30 including a quaternary metal silicide layer 450/550/650 over the epitaxial structure 410/510/610. By providing the quaternary metal silicide layer 450/550/650 including the second metal material whose atomic size is greater than the first metal material, diffusion/extrusion or spiking defects and boron out-diffusion issue are all mitigated. And thus stability and reliability of the metal silicide layers 450/550/650 and the transistors 420/520/620 are improved. Further, in some embodiments, as semiconductor technology pushes to 10 nanometers (N10) and below scale, such improvements are more appreciable.

In some embodiments, a method for manufacturing a semiconductor is provided. In some embodiments, the method includes following steps. An epitaxial structure including a first semiconductor material and a second semiconductor material is provided. A lattice constant of the second semiconductor material is greater than a lattice constant of the first semiconductor material. A metal-containing layer is deposited on the epitaxial structure. The metal containing layer includes a first metal material and a second metal material. An atomic size of the second metal material is greater than an atomic size of the first metal material. And the metal-containing layer and the epitaxial structure are annealed to form a metal silicide layer on the epitaxial structure. The metal silicide layer includes the first semiconductor material, the second semiconductor material, the first metal material, and the second metal material.

In some embodiments, a method for manufacturing a semiconductor structure is provided. The method includes following steps. An epitaxial structure including a first semiconductor material and a second semiconductor material is provided. A lattice constant of the second semiconductor material is greater than a lattice constant of the first semiconductor material. A metal-containing layer is disposed on the epitaxial structure. The metal-containing layer includes at least a first metal material. An ion implantation is performed to implant ions of a second metal material to the metal-containing layer. The meal-containing layer and the epitaxial structure are annealed to form a metal silicide layer over the epitaxial structure. The metal silicide layer includes the first semiconductor material, the second semiconductor material, the first metal material, and the second metal material.

In some embodiments, a semiconductor structure is provided. The semiconductor structure includes an epitaxial structure including a first semiconductor material and a second semiconductor material, and a quaternary metal silicide layer on the epitaxial structure. A lattice constant of the second semiconductor material is greater than a lattice constant of the first semiconductor material. The quaternary metal silicide layer includes the first semiconductor material, the second semiconductor material, a first metal material, and a second metal material. And an atomic size of the first metal material is greater than an atomic size of the second metal material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

providing an epitaxial structure comprising a first semiconductor material and a second semiconductor material, and a lattice constant of the second semiconductor material being greater than a lattice constant of the first semiconductor material;

depositing a metal-containing layer on the epitaxial structure, the metal-containing layer comprising the first semiconductor material, a first metal material and a second metal material, and an atomic size of the second metal material being greater than an atomic size of the first metal material; and annealing the metal-containing layer and the epitaxial structure to form a metal silicide layer on the epitaxial structure, the metal silicide layer comprising the first semiconductor material, the second semiconductor material, the first metal material and the second metal material.

2. The method of claim 1, wherein the first semiconductor material comprises silicon (Si), and the second semiconductor material comprises germanium (Ge).

3. The method of claim 1, wherein a concentration of the second metal material in the metal-containing layer is less than a concentration of the first metal material in the metal-containing layer.

4. The method of claim 1, wherein the first metal material comprises titanium (Ti).

5. The method of claim 4, wherein the second metal material comprises tungsten (W), tantalum (Ta), platinum (Pt), niobium (Nb), or gold (Au).

6. The method of claim 1, wherein a temperature of the anneal is lower than 600° C.

7. The method of claim 1, further comprising forming a contact plug over the epitaxial structure.

8. A method for forming a semiconductor structure, comprising:
   providing an epitaxial structure comprising a first semiconductor material and a second semiconductor material, and a lattice constant of the second semiconductor material being greater than a lattice constant of the first semiconductor material;
   disposing a metal-containing layer on the epitaxial structure, the metal-containing layer comprising at least a first metal material;
   performing an ion implantation to implant ions of a second metal material to the metal-containing layer; and
   annealing the metal-containing layer and the epitaxial structure to form a metal silicide layer on the epitaxial structure, the metal silicide layer comprising the first semiconductor material, the second semiconductor material, the first metal material and the second metal material.

9. The method of claim 8, wherein the first semiconductor material comprises Si, and the second semiconductor material comprises Ge.

10. The method of claim 8, wherein the metal-containing layer further comprises the first semiconductor material.

11. The method of claim 8, wherein an atomic size of the second metal material is greater than an atomic size of the first metal material.

12. The method of claim 8, wherein a concentration of the second metal material in the metal silicide layer is less than a concentration of the first metal material in the metal silicide layer.

13. The method of claim 8, wherein the first metal material comprises Ti.

14. The method of claim 13, wherein the second metal material comprises W, Ta, Pt, Nb, or Au.

15. The method of claim 8, wherein a temperature of the anneal is lower than 600° C.

16. A semiconductor structure comprising:
   an epitaxial structure comprising a first semiconductor material and a second semiconductor material, and a lattice constant of the second semiconductor material being greater than a lattice constant of the first semiconductor material;
   a quaternary metal silicide layer on the epitaxial structure, wherein the quaternary silicide layer comprises the first semiconductor material, the second semiconductor material, a first metal material and a second metal material, and an atomic size of the second metal material is greater than an atomic size of the first metal material; and
   a conductive plug penetrating the quaternary metal silicide layer,
   wherein a bottom most surface of the conductive plug is lower than a bottom most surface of the quaternary silicide layer.

17. The semiconductor structure of claim 16, wherein the quaternary metal silicide layer comprises TiXSiGe.

18. The semiconductor structure of claim 17, wherein "X" of the quaternary metal silicide layer comprises W, Ta, Pt, Nb, or Au.

19. The semiconductor structure of claim 16, wherein a concentration of the second metal material is less than a concentration of the first metal material.

20. The method of claim 8, further comprising forming a contact plug over the epitaxial structure.

* * * * *